(12) United States Patent
Lin

(10) Patent No.: US 11,048,336 B2
(45) Date of Patent: Jun. 29, 2021

(54) LUMINOUS KEYBOARD

(71) Applicant: Primax Electronics Ltd., Taipei (TW)

(72) Inventor: Yu-Ming Lin, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 150 days.

(21) Appl. No.: 16/189,488

(22) Filed: Nov. 13, 2018

(65) Prior Publication Data

US 2019/0171297 A1    Jun. 6, 2019

(30) Foreign Application Priority Data

Dec. 1, 2017   (TW) ................................. 106142216

(51) Int. Cl.
| | |
|---|---|
| *G06F 3/02* | (2006.01) |
| *G06F 3/023* | (2006.01) |
| *H01H 13/83* | (2006.01) |
| *H03K 17/967* | (2006.01) |
| *H01H 13/704* | (2006.01) |

(52) U.S. Cl.
CPC .......... *G06F 3/0202* (2013.01); *G06F 3/0238* (2013.01); *H01H 13/704* (2013.01); *H01H 13/83* (2013.01); *H03K 17/967* (2013.01); *H01H 2219/036* (2013.01)

(58) Field of Classification Search
CPC ... G06F 3/0202; G06F 3/0238; H01H 13/704; H01H 13/83; H01H 2219/036; H03K 17/967
See application file for complete search history.

(56) References Cited

U.S. PATENT DOCUMENTS

| | | | |
|---|---|---|---|
| 10,276,326 B1 * | 4/2019 | Wang ...................... H02J 50/10 |
| 2014/0166456 A1 * | 6/2014 | Chen ...................... H01H 13/83 |
| | | | 200/5 A |

* cited by examiner

*Primary Examiner* — William Boddie
*Assistant Examiner* — Saifeldin E Elnafia
(74) *Attorney, Agent, or Firm* — Kirton McConkie; Evan R. Witt

(57) ABSTRACT

A luminous keyboard includes plural key structures, a switch circuit board, a supporting plate, a backlight module and plural ring-shaped structures. The switch circuit board is located under the keycaps of the key structures. The supporting plate is located under the switch circuit board and connected with the key structures. The backlight module is located under the supporting plate. The backlight module generates a light beam. The plural ring-shaped structure are disposed on the switch circuit board and arranged around the corresponding key structures. When the light beam is reflected by the key structures, the light beam is received by the plural ring-shaped structure. Due to the material properties of the ring-shaped structures, the periphery regions of the keycaps generate a uniform luminous effect.

10 Claims, 4 Drawing Sheets

LUMINOUS KEYBOARD

FIELD OF THE INVENTION

The present invention relates to a keyboard, and more particularly to a luminous keyboard with an illuminating function.

BACKGROUND OF THE INVENTION

Generally, the widely-used peripheral input device of a computer system includes for example a mouse device, a keyboard, a trackball device, or the like. Via the keyboard, characters and symbols can be directly inputted into the computer system. As a consequence, most users and most manufacturers of input devices pay much attention to the development of keyboards.

FIG. 1 is a schematic top view illustrating the outer appearance of a conventional keyboard. As shown in FIG. 1, there are plural keys 10 on a surface of the conventional keyboard 1. These keys 10 are classified into several types, e.g. ordinary keys 101, numeric keys 102 and function keys 103. When one of these keys 10 is depressed by the user's finger, a corresponding signal is issued to the computer, and thus the computer executes a function corresponding to the depressed key. For example, when an ordinary key 101 is depressed, a corresponding English letter or symbol is inputted into the computer. When a numeric key 102 is depressed, a corresponding number is inputted into the computer. In addition, the function keys 103 (F1~F12) can be programmed to provide various functions. For example, the conventional keyboard 1 is a keyboard for a notebook computer.

With the maturity of the computing technologies, the keyboard manufacturers make efforts in designing novel keyboards with special functions in order to meet diversified requirements of different users. For this reason, luminous keyboards are favored by users. The outer appearance of the conventional luminous keyboard is substantially similar to the outer appearance of the conventional keyboard 1. Since the luminous keyboard provides the function of illuminating the keys, the inner structure of the luminous keyboard is different from the inner structure of the keyboard without the illuminating function. Hereinafter, the inner structure of the luminous keyboard will be illustrated in more details. FIG. 2 is a schematic cross-sectional view illustrating a conventional luminous keyboard. As shown in FIG. 2, the conventional luminous keyboard 2 comprises plural key structures 20, a membrane switch circuit board 21, a supporting plate 22 and a backlight module 23. Each key structure 20 comprises a keycap 201, a scissors-type connecting element 202 and an elastic element 203. In the key structure 20, the keycap 201 is exposed outside the conventional luminous keyboard 2, so that the keycap 201 can be depressed by the user. The scissors-type connecting element 202 is used for connecting the keycap 201 and the supporting plate 22. The elastic element 203 is penetrated through the scissors-type connecting element 202. In addition, both ends of the elastic element 203 are contacted with the keycap 201 and the membrane switch circuit board 21, respectively. The supporting plate 22 is located under the membrane switch circuit board 21. The keycap 201, the scissors-type connecting element 202, the elastic element 203 and the membrane switch circuit board 21 are supported on the supporting plate 22.

The membrane switch circuit board 21 comprises an upper wiring board 211, a separation layer 212, and a lower wiring board 213. The upper wiring board 211, the separation layer 212 and the lower wiring board 213 are all made of a light-transmissible material. The light-transmissible material is for example polycarbonate (PC) or polyethylene (PE). The upper wiring board 211 has plural upper contacts 2111. The separation layer 212 is located under the upper wiring board 211, and comprises plural perforations 2121 corresponding to the plural upper contacts 2111. The lower wiring board 213 is located under the separation layer 212, and comprises plural lower contacts 2131 corresponding to the plural upper contacts 2111. The plural lower contacts 2131 and the plural upper contacts 2111 are collectively defined as plural key switches 214.

The backlight module 23 comprises a light guide plate 230, an illumination circuit board 231, plural light-emitting elements 232, a reflecting plate 233 and a light-shading plate 234. For clarification and brevity, only two light-emitting elements 232 are shown in the drawing. The light guide plate 230 is located under the supporting plate 22. The illumination circuit board 231 is located under the membrane switch circuit board 21 and electrically connected with the light-emitting elements 232. The illumination circuit board 231 provides electric power to the plural light-emitting elements 232. The plural light-emitting elements 232 are disposed on the illumination circuit board 231. In addition, the plural light-emitting elements 232 are inserted into plural reflecting plate openings 2331 of the reflecting plate 233 and plural light guide plate openings 2301 of the light guide plate 230, respectively. By acquiring the electric power, the plural light-emitting elements 232 are driven to emit plural light beams B. Moreover, the plural light beams B are introduced into the light guide plate 230. After portions of the light beams B are exited from the light guide plate 230, the light beams B are reflected back into the light guide plate 320 by the reflecting plate 233. The light-shading plate 234 is located over the light guide plate 230 for shading the light beams B. For example, the plural light-emitting elements 232 are side-view light emitting diodes. After the light beams B are introduced into the light guide plate 230, the light beams B are subjected to total internal reflection within the light guide plate 230. Then, the light beams B are guided to the keycap 201 by the light guide plate 230.

From top to bottom, the keycap 201, the scissors-type connecting element 202, the elastic element 203, the membrane switch circuit board 21, the supporting plate 22, the light-shading plate 234, the light guide plate 230 and the reflecting plate 233 of the conventional luminous keyboard 2 are sequentially shown. For example, the conventional luminous keyboard 2 is a keyboard for a notebook computer (not shown).

In the conventional luminous keyboard 2, each keycap 201 has a light-outputting zone 2011. The light-outputting zone 2011 is located at a character region or a symbol region of the keycap 201. Moreover, the position of the light-outputting zone 2011 is aligned with the position of a corresponding light-guiding dot 2302 of the light guide plate 230. The light beams can be guided upwardly to the light-outputting zone 2011 by the corresponding light-guiding dot 2302. The light-shading plate 234 comprises plural light-shading plate openings 2341. The plural light-shading plate openings 2341 are aligned with the corresponding light-guiding dots 2302 and the corresponding light-outputting zones 2011. Consequently, the light beams B are transmitted through the light-shading plate openings 2341 of the light-shading plate 234. Similarly, the supporting plate 22 comprises plural supporting plate openings 221. The plural supporting plate openings 221 are aligned with the corresponding light-guiding dots 2302 and the corresponding light-outputting zones 2011. Consequently, the light beams B are transmitted through the supporting plate openings 221 of the supporting plate 22.

On the other hand, since the membrane switch circuit board 21 is made of the light-transmissible material, the plural light beams B can be transmitted through the membrane switch circuit board 21. Consequently, after the plural light beams B are guided by the light-guiding dots 2302, the plural light beams B are sequentially transmitted through the plural supporting plate openings 221 and the membrane switch circuit board 21 and directed to the plural light-outputting zones 2011, thereby illuminating the character region or the symbol region of the keycap 201. Under this circumstance, the illuminating function is achieved.

In view of the optical paths of the light beams B, the conventional luminous keyboard still has some drawbacks. For example, after the light beams B are transmitted through the supporting plate openings 221 and projected to the keycaps 201 and the scissors-type connecting element 202, only a portion of the light beams B are projected to the light-outputting zones 2011. The remaining portion of the light beams B are reflected by the keycaps 201 and the scissors-type connecting element 202, and leaked out through the vacant spaces g between the keycaps 201 and the membrane switch circuit board 21. Consequently, a periphery region 2012 of the keycap 201 provides a ring-shaped luminous effect. However, since the supporting plate openings 221 are uniformly distributed in the supporting plate 22, the light beams B cannot be uniformly outputted. Under this circumstance, the ring-shaped luminous effect provided by the periphery region 2012 of the keycap 201 is usually not uniform.

Therefore, there is a need of providing a luminous keyboard for providing uniform illuminating efficacy.

SUMMARY OF THE INVENTION

An object of the present invention provides a luminous keyboard for providing uniform illuminating efficacy.

In accordance with an aspect of the present invention, there is provided a luminous keyboard. The luminous keyboard includes at least one key structure, a switch circuit board, a supporting plate, a backlight module and at least one ring-shaped structure. The at least one key structure is exposed outside the luminous keyboard. The switch circuit board is located under the at least one key structure. When the switch circuit board is triggered by the at least one key structure, a corresponding key signal is generated. The switch circuit board includes at least one circuit board opening. The supporting plate is located under the switch circuit board and connected with the at least one key structure. The supporting plate includes at least one supporting plate opening corresponding to the at least one circuit board opening. The backlight module is located under the supporting plate. The backlight module generates a light beam and projects the light beam to the at least one key structure through the at least one supporting plate opening and the at least one circuit board opening. The at least one ring-shaped structure corresponds to the at least one key structure. The at least one ring-shaped structure is disposed on the switch circuit board and arranged around the corresponding key structure. When the light beam is reflected by the at least one key structure, the light beam is received by the at least one ring-shaped structure. Consequently, a luminous effect is generated.

From the above descriptions, the present invention provides the luminous keyboard. The ring-shaped structures are made of the fluorescent material or the light diffusion material. Moreover, the ring-shaped structures are disposed on the switch circuit board and at the positions under the periphery regions of the keycaps. That is, the ring-shaped structures are disposed within the vacant spaces between the keycaps and the switch circuit board. The portions of the light beams that are not projected to the light-outputting zones of the keycaps are reflected to the ring-shaped structures by the keycaps and the connecting elements. Due to the material properties of the ring-shaped structures, the periphery regions of the keycaps can provide the uniform luminous effect or the uniform light diffusion effect. In other words, the luminous keyboard of the present invention can provide enhanced luminous uniformity.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
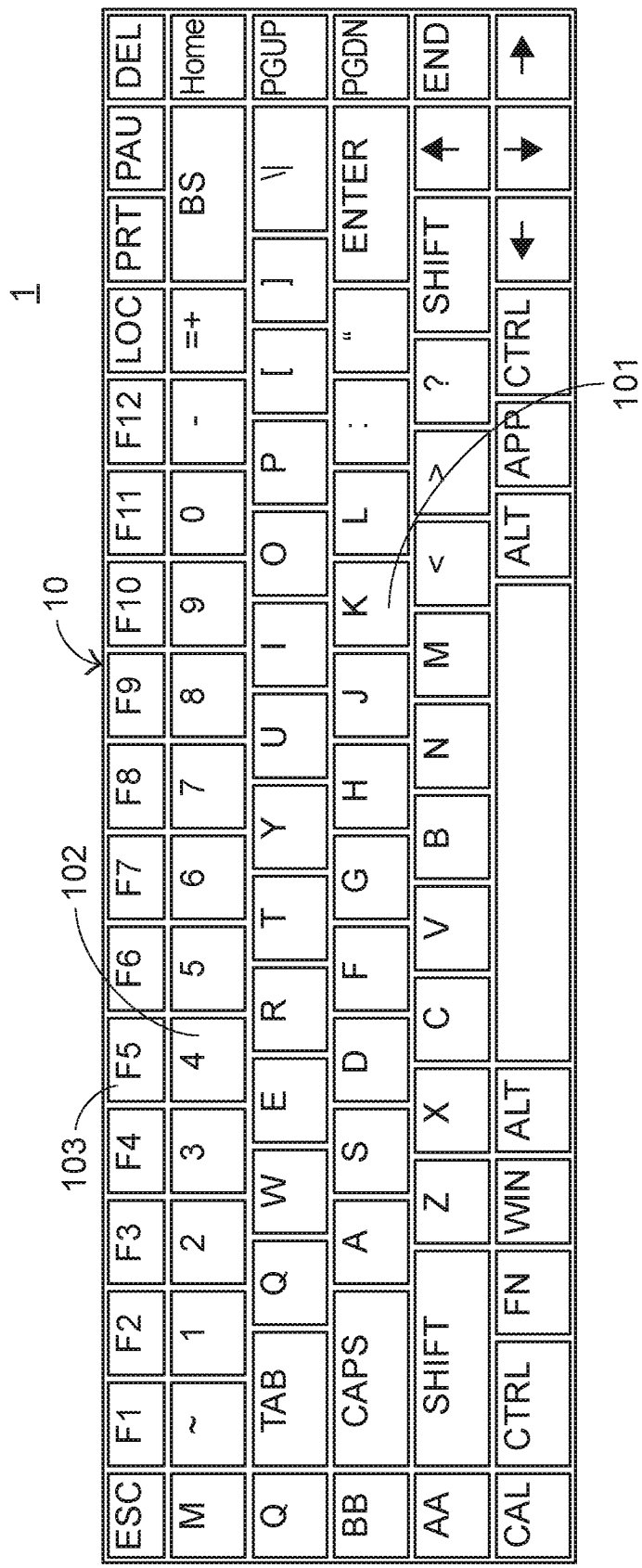
FIG. 1 is a schematic top view illustrating the outer appearance of a conventional keyboard.
Figure 2:
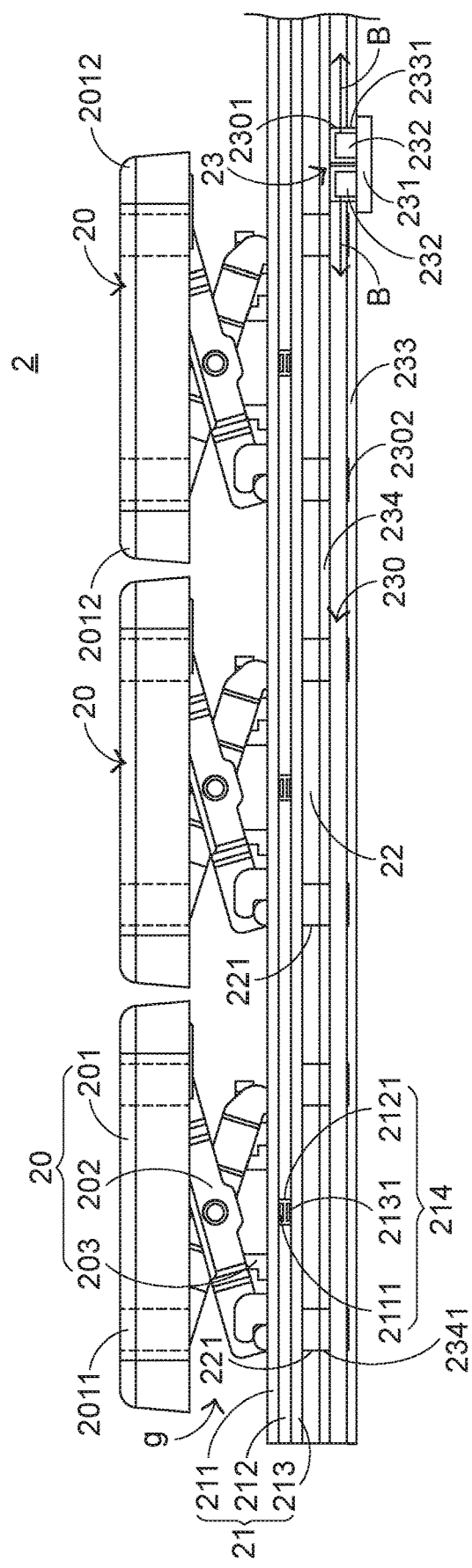
FIG. 2 is a schematic cross-sectional view illustrating a conventional luminous keyboard.
Figure 3:
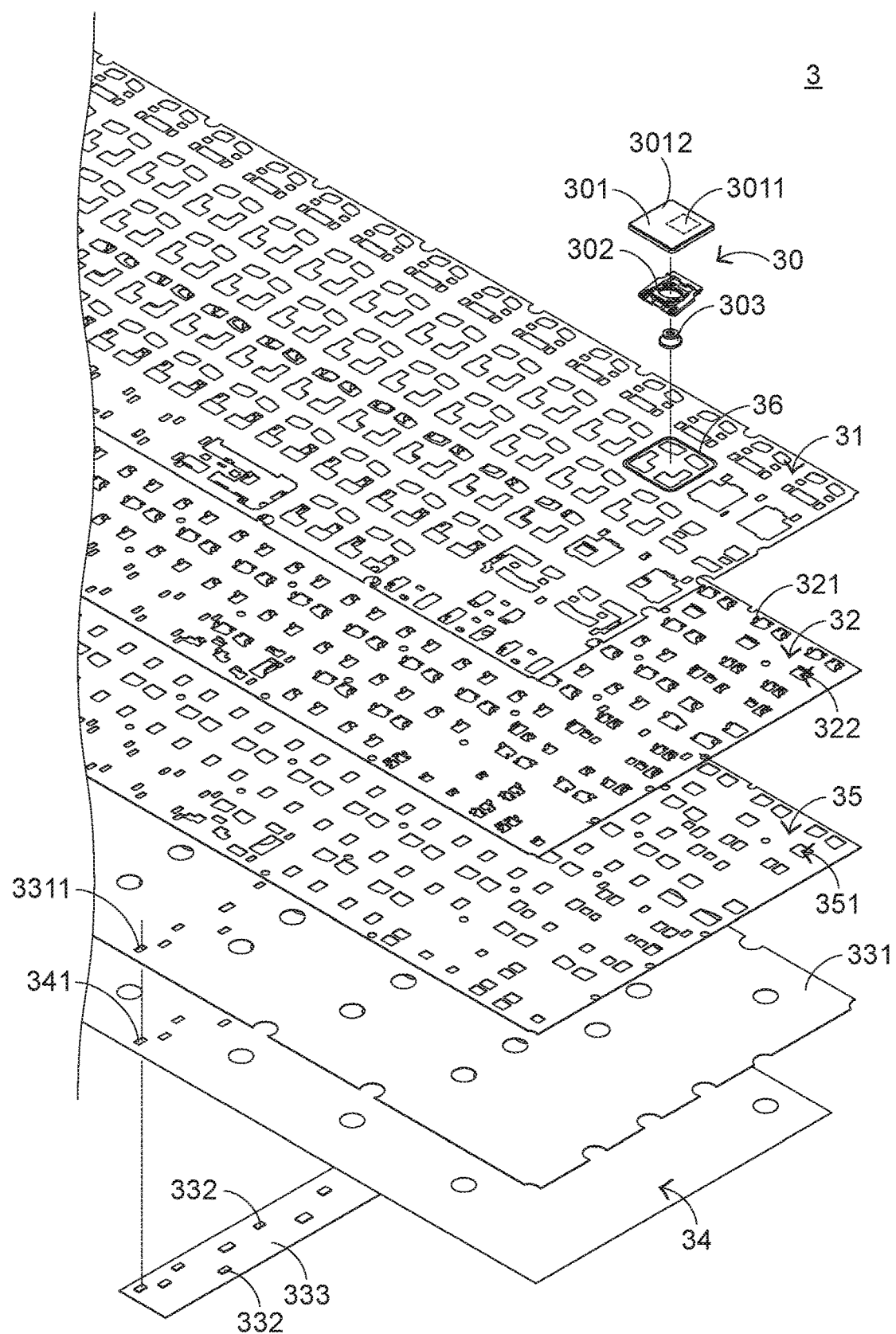
FIG. 3 is a schematic exploded view illustrating a portion of a luminous keyboard according to an embodiment of the present invention.
Figure 4:
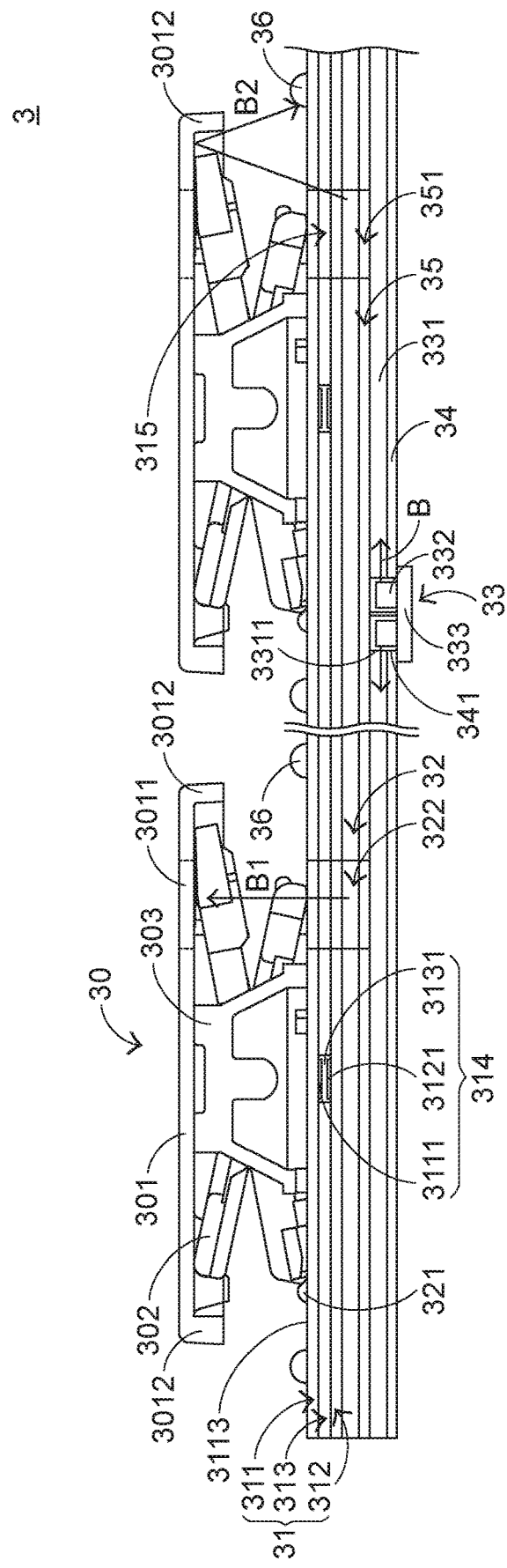
FIG. 4 is a schematic cross-sectional view illustrating a portion of the luminous keyboard according to the embodiment of the present invention.

For overcoming the drawbacks of the conventional technology, the present invention provides a luminous keyboard. The structure of the luminous keyboard will be described with reference to FIGS. 3 and 4. FIG. 3 is a schematic exploded view illustrating a portion of a luminous keyboard according to an embodiment of the present invention. FIG. 4 is a schematic cross-sectional view illustrating a portion of the luminous keyboard according to the embodiment of the present invention. The luminous keyboard 3 comprises plural key structures 30, a switch circuit board 31, a supporting plate 32, a backlight module 33, a reflecting plate 34, a light-shading plate 35 and plural ring-shaped structures 36. The plural key structures 30 are exposed outside the luminous keyboard 3. The switch circuit board 31 is located under the plural key structures 30. When the switch circuit board 31 is triggered by one of the plural key structures 30, a corresponding key signal is generated. The supporting plate 32 is located under the switch circuit board 31 and connected with the plural key structures 30. The supporting plate 32 comprises plural hooks 321 and plural supporting plate openings 322. The backlight module 33 is located under the supporting plate 32. The backlight module 33 is used for emitting light beams B and projecting the light beams B to the plural key structures 30. The reflecting plate 34 is disposed within the backlight module 33 for reflecting the light beams B. The light-shading plate 35 is arranged between the backlight module 33 and the supporting plate 32 for shading the light beams B. Each of the ring-shaped structures 36 corresponds to one of the key structure 30. The plural ring-shaped structures 36 are disposed on the switch circuit board 31 and arranged around the corresponding key structures 30. When the ring-shaped structures 36 receive the light beams B that are reflected from the key structures 30, the illuminating efficacy of the key structures 30 is enhanced.

As shown in FIGS. 3 and 4, each key structure 30 comprises a keycap 301, a connecting element 302 and an elastic element 303. Each keycap 301 has a light-outputting zone 3011. After the light beams B pass through the light-outputting zone 3011, the key 31 is illuminated. The keycap 301 is exposed outside the luminous keyboard 3, and thus the keycap 301 can be depressed by the user. The connecting element 302 is used for connecting the keycap 301 and the hooks 321 of the supporting plate 32. Consequently, the keycap 301 is moved upwardly or downwardly relative to the supporting plate 32. The elastic element 303 is penetrated through the connecting element 302. In addition, both ends of the elastic element 303 are contacted with the keycap 301 and the switch circuit board 31, respectively. As the keycap 301 is moved downwardly to push the elastic element 303, the switch circuit board 31 is pressed by the elastic element 303.

In this embodiment, the connecting element 302 is a scissors-type connecting element, and the elastic element 303 is a rubbery elastomer. Preferably but are not exclusively, the plural keycaps 301 of the plural keys are moved upwardly or downwardly with the connecting elements 302, and the switch circuit board 31 is depressed by the elastic elements 303 through the connecting elements 302. In another embodiment, the connecting elements are non-scissors connecting elements for controlling movements of the keys. For example, a crater-shaped connecting element for a desktop computer is one of the non-scissors connecting elements. In a further embodiment, the keycaps are moved upwardly or downwardly in response to magnetic forces.

The structure of the switch circuit board 31 will be described as follows. Please refer to FIG. 4. The switch circuit board 31 comprises an upper wiring plate 311, a lower wiring plate 312 and a separation layer 313. The upper wiring plate 311 is contacted with the elastic elements 303 of the key structures 30. The upper wiring board 311 has plural upper contacts 3111. The lower wiring plate 312 is located under the upper wiring plate 311. The lower wiring plate 312 comprises plural lower contacts 3121 corresponding to the plural upper contacts 3111. The separation layer 313 is arranged between the upper wiring plate 311 and the lower wiring plate 312. When the key structure 30 is not depressed, the upper wiring plate 311 and the lower wiring plate 312 are separated from each other by the separation layer 313. Consequently, the upper contact 3111 and the corresponding low contact 3121 are not erroneously contacted. The separation layer 313 comprises plural perforations 3131 corresponding to the plural upper contacts 3111. The plural upper contacts 3111, the plural lower contacts 3121 and the plural perforations 3131 are collectively defined as plural key switches 314. When the switch circuit board 31 is pressed by the elastic element 303, the corresponding upper contact 3111 is inserted into the corresponding perforation 3131 and contacted with the corresponding lower contact 3121. Consequently, the corresponding key signal is generated.

In an embodiment, the switch circuit board 31 is a membrane switch circuit board. Moreover, the upper wiring plate 311, the lower wiring plate 312 and the separation layer 313 are made of a light-transmissible material for allowing the light beams B to go through. Moreover, as shown in FIG. 3, the switch circuit board 31 further comprises plural circuit board openings 315. The plural circuit board openings 315 are aligned with the corresponding supporting plate openings 322. Moreover, the plural circuit board openings 315 run through the upper wiring plate 311, the separation layer 313 and the lower wiring plate 312.

The structure of the backlight module 33 will be described as follows. The backlight module 33 comprises a light guide plate 331, plural light-emitting elements 332 and an illumination circuit board 333. The light guide plate 331 is arranged between the light-shading plate 35 and the reflecting plate 34. The light guide plate 331 is used for guiding the light beams B to the light-outputting zones 3011 through the supporting plate openings 322 and the illumination circuit board openings 315. The light guide plate 331 comprises plural light guide plate openings 3311 and plural light-guiding parts (not shown). Each light guide plate opening 3311 is aligned with one of the plural light-emitting elements 332. The light-guiding parts are used for guiding the light beams B to be exited from the light guide plate 331 and transmitted through the supporting plate openings 322 and the illumination circuit board openings 315. The light-emitting elements 332 are used for generating the light beams B. The plural light-emitting elements 332 are supported on the illumination circuit board 334. The illumination circuit board 334 is located under the reflecting plate 34 and electrically connected with the light-emitting elements 332. The illumination circuit board 334 provides electric power to the plural light-emitting elements 332. By acquiring the electric power, the plural light-emitting elements 332 are driven to emit the light beams B. In this embodiment, the light-emitting element 332 is a side-view light emitting diode, the light-guiding part is one of a light-guiding microstructure, a light-guiding dot, a light-guiding ink and a light-guiding texturing structure, and the illumination circuit board 334 is a flexible printed circuit (FPC).

The reflecting plate 34 is arranged between the light guide plate 331 and the illumination circuit board 333. The reflecting plate 34 comprises plural reflecting plate openings 341. The reflecting plate openings 341 are aligned with the corresponding light guide plate openings 3311. The light-emitting elements 332 are inserted into the corresponding reflecting plate openings 341 and the corresponding light guide plate openings 3311. Consequently, the light beams B from the light-emitting elements 332 are introduced into the light guide plate 331. The light-shading plate 35 is arranged between the supporting plate 32 and the light guide plate 331. The light-shading plate 35 comprises plural light-shading plate openings 351. The plural light-shading plate openings 351 are aligned with the corresponding to the supporting plate openings 322. Consequently, the light beams B are transmitted through the light-shading plate openings 351 and the supporting plate openings 322, and projected to the corresponding light-outputting zones 3011 of the keycaps 301.

In an embodiment, the plural ring-shaped structures 36 are produced by dispensing, coating or attaching a fluorescent material on the switch circuit board 31 and at the positions under the periphery regions 3012 of the keycaps 301. That is, the ring-shaped structures 36 are arranged around the positions overlying the corresponding circuit board openings 315 and the corresponding supporting plate openings 322. In an example of the attaching process, the fluorescent material is firstly formed on a sticker paper and then the sticker paper is adhered on the switch circuit board.

When the light-emitting elements 332 are driven to emit the light beams B, the light beams B are introduced into the light guide plate 331. The light beams B are guided by the light-guiding parts and exited from the light guide plate 331. Then, the light beams B are transmitted through the light-shading plate openings 351, the supporting plate openings 322 and the illumination circuit board openings 315 of the switch circuit board 31, and projected to the corresponding light-outputting zones 3011 of the keycaps 301. Moreover, portions of the light beams B are exited from the light guide plate 331 but not guided by the light-guiding parts. The portions of the light beams B that are exited from the light guide plate 331 are reflected back into the light guide plate 331 by the reflecting plate 34 and further guided to the light-outputting zones 3011 by the light-guiding parts. After the light beams B are transmitted through the supporting plate openings 322 and the illumination circuit board openings 315, first-portion beams B1 of the light beams B are projected to the light-outputting zones 3011 in order to illuminate the light-outputting zones 3011. In addition, second-portion beams B2 of the light beams B are reflected to the ring-shaped structures 36 by the keycaps 301 and the connecting elements 302. Since the ring-shaped structures 36 are made of the fluorescent material, the periphery regions 3012 of the keycaps 301 can provide the uniform luminous effect. Consequently, even if the supporting plate openings 322 are not uniformly distributed in the supporting plate 32, the light beams B can be uniformly projected.

The operations of depressing the keycap 301 of the luminous keyboard 3 will be described as follows. Please refer to FIG. 3 again. While one of the keycaps 301 is depressed by the user's finger, the keycap 301 is moved downwardly in response to the external force. Since the connecting element 302 is pushed by the keycap 301, the connecting element 302 is correspondingly swung relative to the supporting plate 32. Moreover, as the keycap 301 is moved downwardly to push the elastic element 303, the elastic element 303 is subjected to deformation to trigger the corresponding key switch 314 of the switch circuit board 31. Consequently, the switch circuit board 31 generates a corresponding key signal. When the keycap 301 is no longer depressed by the user and no external force is exerted on the keycap 301, the elastic element 303 is not pushed by the keycap 301. Meanwhile, the elastic element 303 is restored to its original shape from the deformed state in response to the elasticity of the elastic element 303. In addition, the elastic element 303 provides an upward restoring force to the keycap 301. As the keycap 301 is moved upwardly, the connecting element 302 is correspondingly swung. Consequently, the keycap 301 is returned to its original position.

The following two aspects should be specially described. Firstly, the ring-shaped structures of the luminous keyboard are made of a light diffusion material. In an embodiment, the ring-shaped structures are produced by dispensing, coating or attaching the light diffusion material on the switch circuit board and at the positions under the periphery regions of the keycaps. That is, the ring-shaped structures are arranged around the positions overlying the corresponding circuit board openings and the corresponding supporting plate openings. In an example of the attaching process, the light diffusion material is firstly formed on a sticker paper and then the sticker paper is adhered on the switch circuit board. Consequently, the second-portion beams of the light beams are reflected to the ring-shaped structures by the keycaps and the connecting elements. Under this circumstance, the periphery regions of the keycaps can provide the uniform light diffusion effect. Secondly, the reflecting plate and the light-shading plate are not the essential components of the luminous keyboard. That is, the luminous keyboard is selectively equipped with the reflecting plate and the light-shading plate according to the practical requirements.

From the above descriptions, the present invention provides the luminous keyboard. The ring-shaped structures are made of the fluorescent material or the light diffusion material. Moreover, the ring-shaped structures are disposed on the switch circuit board and at the positions under the periphery regions of the keycaps. That is, the ring-shaped structures are disposed within the vacant spaces between the keycaps and the switch circuit board. The portions of the light beams that are not projected to the light-outputting zones of the keycaps are reflected to the ring-shaped structures by the keycaps and the connecting elements. Due to the material properties of the ring-shaped structures, the periphery regions of the keycaps can provide the uniform luminous effect or the uniform light diffusion effect. In other words, the luminous keyboard of the present invention can provide enhanced luminous uniformity.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all modifications and similar structures.

What is claimed is:

1. A luminous keyboard, comprising:
   at least one key structure exposed outside the luminous keyboard;
   a switch circuit board located under the at least one key structure, wherein when the switch circuit board is triggered by the at least one key structure, a corresponding key signal is generated, wherein the switch circuit board comprises at least one circuit board opening;
   a supporting plate located under the switch circuit board and connected with the at least one key structure, wherein the supporting plate comprises at least one supporting plate opening corresponding to the at least one circuit board opening;
   a backlight module located under the supporting plate, and generating a light beam and projecting the light beam to the at least one key structure through the at least one supporting plate opening and the at least one circuit board opening; and
   at least one ring-shaped structure corresponding to the at least one key structure, wherein the at least one ring-shaped structure comprises a fluorescent material of a light diffusion material, wherein the at least one ring-shaped structure is disposed on the switch circuit board and arranged around the corresponding key structure at a periphery region of the keycap, wherein when the light beam is reflected by the at least one key structure, the reflected light beam is received by the at least one ring-shaped structure, so that a luminous effect is generated at the periphery region.

2. The luminous keyboard according to claim 1, wherein the backlight module comprises:
   a light guide plate located under the supporting plate to guide the light beam to the at least one key structure, wherein the light guide plate comprises a light guide plate opening;
   a light-emitting element inserted into the light guide plate opening, and emitting the light beam;

a reflecting plate located under the light guide plate, wherein the light beam is reflected by the reflecting plate; and an illumination circuit board located under the reflecting plate and electrically connected with the light-emitting element, wherein the light-emitting element is supported on the illumination circuit board.

3. The luminous keyboard according to claim 2, wherein the reflecting plate comprises a reflecting plate opening corresponding to the light guide plate opening, wherein the light-emitting element is inserted into the reflecting plate opening and the light guide plate opening.

4. The luminous keyboard according to claim 1, wherein the at least one key comprises:
   a keycap exposed outside the luminous keyboard, wherein the keycap comprises at least one light-outputting zone, and the light beam is transmitted through the at least one light-outputting zone;
   a connecting element arranged between the supporting plate and the keycap, wherein the supporting plate and the keycap are connected with each other through the connecting element, so that the keycap is movable upwardly or downwardly relative to the supporting plate; and
   an elastic element arranged between the keycap and the switch circuit board, wherein while the keycap is depressed to push the elastic element, the switch circuit board is pressed by the elastic element.

5. The luminous keyboard according to claim 4, wherein while the keycap is depressed, the connecting element is correspondingly swung and the elastic element is pushed by the keycap, so that the elastic element is subjected to deformation to press the switch circuit board, wherein when the keycap is not depressed, the elastic element is restored to an original shape and provides an elastic force to the keycap, so that the keycap is returned to an original position.

6. The luminous keyboard according to claim 4, wherein the at least one ring-shaped structure is produced by dispensing, coating or attaching fluorescent material on the switch circuit board and at the periphery region of the keycap.

7. The luminous keyboard according to claim 6, wherein the at least one ring-shaped structure is arranged around the at least one circuit board opening and the at least one supporting opening, wherein a first portion of the light beam is projected to the at least one light-outputting zone, a second portion of the light beam is reflected to the at least one ring-shaped structure by the keycap and the connecting element, so that the periphery region of the keycap generates the luminous effect.

8. The luminous keyboard according to claim 4, wherein the at least one ring-shaped structure is produced by dispensing, coating or attaching light diffusion material on the switch circuit board and at the periphery region of the keycap.

9. The luminous keyboard according to claim 8, wherein the at least one ring-shaped structure is arranged around the at least one circuit board opening and the at least one supporting opening, wherein a first portion of the light beam is projected to the at least one light-outputting zone, a second portion of the light beam is reflected to the at least one ring-shaped structure by the keycap and the connecting element, so that the periphery region of the keycap generates a light diffusion effect.

10. The luminous keyboard according to claim 4, wherein the switch circuit board comprises:
   an upper wiring board contacted with the elastic element, wherein the upper wiring board comprises an upper conductive part;
   a lower wiring board located under the upper wiring board, wherein the lower wiring board comprises a lower conductive part; and
   a separation layer arranged between the upper wiring board and the lower wiring board, wherein the upper conductive part and the lower conductive part are separated from each other by the separation layer, and the separation layer comprises a separation layer opening,
   wherein when the upper wiring board is triggered by the elastic element, the upper conductive part is penetrated through the separation layer opening and contacted with the lower conductive part, so that the switch circuit board generates the key signal.

* * * * *